METHOD OF MAKING A PIEZOELECTRIC RESONATOR

Original Filed April 19, 1965

INVENTOR.
DONALD J. KONEVAL
DANIEL R. CURRAN
BY
ATTORNEY

United States Patent Office 3,528,851

Patented Sept. 15, 1970

3,528,851

METHOD OF MAKING A PIEZOELECTRIC RESONATOR

Donald J. Koneval, Warrensville Heights, and Daniel R. Curran, Cleveland Heights, Ohio, assignors to Clevite Corporation, a corporation of Ohio Original application Apr. 19, 1965, Ser. No. 448,923, now Patent No. 3,363,119. Divided and this application Sept. 28, 1967, Ser. No. 684,084

Int. Cl. H01v 7/00

U.S. Cl. 117—212 7 Claims

ABSTRACT OF THE DISCLOSURE

A piezoelectric resonator comprising a thin wafer of piezoelectric material is formed by providing on at least one major surface thereof a recess or cavity in which the electrode is positioned. The depth dimensions of the recesses are sized to provide a desired over-all thickness of the electroded region relative to the non-electroded region to achieve a desired mass loading of the electroded region without varying the electrode thickness.

This application is a division of our co-pending patent application Ser. No. 448,923, filed Apr. 19, 1965, now Pat. No. 3,363,119.

This invention relates to piezoelectric resonators and, specifically, to improved high frequency resonators for use in electric filter circuits and the method of making the same.

The invention has utility in connection with piezoelectric resonators comprising a thin wafer of monocrystalline or ceramic material having a vibrational mode producing a particle displacement in the plane of the wafer which is anti-symmetrical about the center plane of the wafer. Such vibrational modes include the thickness shear, thickness twist and torsional modes of all which can be obtained with piezoelectric monocrystalline materials and in piezoelectric ceramic materials.

The typical wafer type of resonator of thickness ($t$) is provided with electrodes of predetermined area on opposite planar surfaces thereof to enable the resonator to be excited electromechanically in its principal vibratory mode. At the resonant condition maximum particle motion and wave motion occurs.

In copending application Ser. No. 672,422, filed Sept. 29, 1969, now Pat. No. 3,384,768, by William Shockley and Daniel R. Curran and assigned to the same assignee as the present invention, said application being a continuation of application Ser. No. 592,947, filed on Nov. 8, 1966, now abandoned, and which was a continuation of application Ser. No. 281,488, filed on May 20, 1963, and subsequently abandoned, there are disclosed resonator structures in which wave propagation beyond the electroded region is minimized to thereby reduce the "range of action" and maximize the mechanical Q. This is accomplished by structurally establishing a relationship between the resonant frequency $f_a$ of the electroded region and the resonant frequency $f_b$ of the surrounding non-electroded region of the wafer whereby the frequency $f_b$ acts as a cut-off frequency for propagation of the vibratory mode from the electroded region. The relationship is preferably such that $f_a/f_b$ is in the range of 0.8 to .999, i.e., a value less than one, as disclosed in application Ser. No. 672,422, now Pat. No. 3,384,768. One disclosed method of accomplishing the frequency relationship is to utilize a calculated electrode thickness $t_e$ relative to the thickness $t_w$ of the wafer to effect a predetermined mass loading of the electroded region whereby its resonant frequency is decreased relative to that of the surrounding wafer material.

With respect to very high frequency (VHF) resonators the electrode mass loading concept as disclosed in application Ser. No. 672,422, now Pat. No. 3,384,768, for reducing wave propagation becomes difficult to use with increase in frequency.

Utilizing the mass loading concept the relationship of the electrode diameter ($d$) of a high frequency resonator structure with other parameters may be expressed by the following equation in accordance with the theory disclosed in our copending application Ser. No. 488,922, filed Apr. 19, 1965, now Pat. 3,401,283:

$$d \leq \frac{M t_w}{n}\left(\frac{f_a}{f_b - f_a}\right)^{1/2} \quad (1)$$

where M is a constant, $t_w$ is the wafer thickness, $n$ is the order of the harmonic (1, 3, 5, etc.), $f_a$ is the resonant frequency of the electroded region of the wafer, $f_b$ is the calculated cut-off resonant frequency of the surrounding non-electroded region.

The effective mechanical Q of a high frequency resonator may be expressed by the following equation:

$$Q = \frac{1}{W C_1 R} \quad (2)$$

where $C_1$ is the motional capacitance of the resonator, W is equal to $2\pi f$, and R is the total resistance (motional resistance plus electrical resistance).

In the case of a high frequency resonator there is a substantial limitation on the maximum diameter at a given frequency which can be obtained since the electrode thickness must be decreased with increase in electrode area to achieve the desired relationship between $f_a$ and $f_b$. As the electrode thickness decreases the resistance of the electrodes and leads will increase causing a reduction in mechanical Q as will be apparent from Equation 2.

It is an object of the present invention to provide a high frequency resonator possessing low resistance, high material capacitance and high mechanical Q.

Another object of the invention is to achieve a smaller degree of mass loading in a high frequency resonator while mounting a low electrical resistance.

Another object of the invention is to provide an improved method of fabricating a high frequency resonator structure.

The invention in general contemplates a resonator structure comprising a thin wafer of piezoelectric material having electrodes on opposite surfaces thereof which coact with the intervening piezoelectric material to form a piezoelectric resonator. The wafer of piezoelectric material is provided with a recess of cavity in at least one major surface thereof in which an electrode is formed or mounted. The structure of the resonator is such that the region of piezoelectric material between the two electrodes is less in thickness than the surrounding region. With this arrangement thicker electrodes can be utilized than would ordinarily be possible in a high frequency resonator having a predetermined electrode diameter since a portion of the electrode thickness forms a portion of the wafer thickness. As a result the optimum relationship between the resonant frequencies of the electroded and non-electroded regions and a low electrode resistance can be obtained for an electrode diameter corresponding to a particular frequency.

Other objects and advantages will become apparent from the following description taken in connection with the accompanying drawing wherein.

Figure 1:
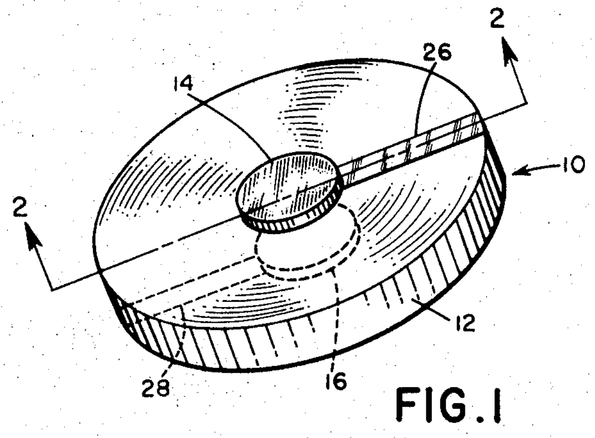
FIG. 1 is a perspective view of a piezoelectric resonator embodying the invention.

Referring to FIG. 1 of the drawing there is shown a piezoelectric resonator identified generally by the reference numeral 10. In general the resonator 10 comprises a thin wafer (in this case circular) of piezoelectric material 12 having a pair of oppositely disposed electrodes 14 and 16 which coact with the intervening piezoelectric material to define a resonator. Preferably resonator 10 is of the wafer type shown in FIG. 1 formed from monocrystalline or ceramic material having a vibrational mode producing a particle displacement in the plane of the wafer which is antisymmetrical about the center plane of the wafer, e.g., thickness shear, thickness twist and torsional modes.

Known monocrystalline piezoelectric materials include quartz, Rochelle Salt, DKT (di-potassium tartrate), lithium sulfate or the like. As is well known to those skilled in the crystallographic arts, the basic vibrational mode of a crystal wafer is determined by the orientation of the wafer with respect to the crystallographic axis of the crystal from which it is cut. It is known for example that a "0° Z-cut" of DKT or an "AT-cut" of quartz may be used for a thickness shear mode of vibration.

Of the various monocrystalline piezoelectrics available quartz, primarily because of its stability and high mechanical quality factor $Q_m$ is a preferred material for narrow band filter applications. An "AT-cut" quartz wafer responds in the thickness shear mode to a potential gradient between its major surfaces and is particularly suitable.

For wider band filters the wafers are preferably fabricated of a suitable polarizable ferroelectric ceramic material such as barium titanate, lead zirconate-lead titanate, or various chemical modifications thereof. Suitable ceramic material for the purposes of the invention are ceramic compositions of the type disclosed and claimed in U.S. Pat. No. 3,006,857 and the copending application of Frank Kulcsar and William R. Cook, Jr., Ser. No. 164,-076, filed Jan. 3, 1962, now Pat. No. 3,179,594, and assigned to the same assignee as the present invention. Such ferroelectric ceramic compositions may be polarized by methods known to those skilled in the art. For example, a thickness shear mode of vibration may be accomplished through polarization in a direction parallel to the major surfaces of a wafer, in the manner described in U.S. Pat. 2,646,610 to A. L. W. Williams.

While, as discussed, the inventive concept is equally applicable to monocrystalline or ceramic piezoelectric wafers having a vibrational mode wherein the partial motion is antisymmetrical with respect to the center plane, the disclosure will be in regard to resonators comprising an "AT-cut" quartz crystal.

In accordance with the teaching of copending application Ser. No. 448,922, now Pat. 3,401,283 the resonator 10 defines an electroded region which has a resonant frequency $f_a$ less than the resonant frequency $f_b$ of the surrounding region. Preferably the frequencies $f_a$ and $f_b$ are related whereby $f_a/f_b$ is in the range of 0.8 to .99999.

Figure 2:
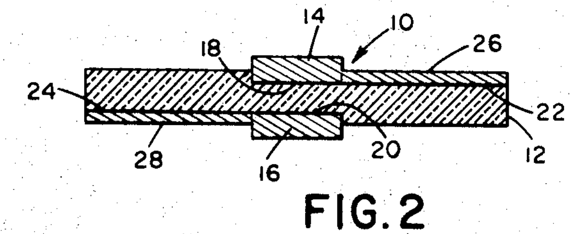
FIG. 2 is a section taken along line 2—2 of FIG. 1.

To achieve a desired electrode diameter and thickness and a desired relationship between $f_a$ and $f_b$, the wafer 12 is provided with oppositely disposed recesses or cavities 18 and 20 of dimensions complemental to the planar dimensions of the electrodes 14 and 16. The electrodes 14 and 16 are formed or received within recesses 18 and 20 and have a predetermined thickness which may exceed, equal or be less than the depth of recesses 18 and 20 depending on the density of the electrode material. In FIG. 2 the electrodes 14 and 16 are shown as having a thickness greater than the depth of the recesses 18 and 20.

The wafer 12 is additionally provided with elongated recesses 22 and 24 on the opposite face surface thereof which extend from the wafer edge to the recesses 18 and 20 respectively. A pair of electrically conductive leads 26 and 28 are formed or received within recesses 22 and 24 respectively to facilitate attachment of electrodes 14 and 16 to electrical circuits.

The electrodes 14 and 16 and leads 26 and 28 may be separately fabricated as parts and then cemented in their respective recesses or may be formed by vapor depositing material such as aluminum, gold or silver directly into the recesses utilizing suitable masking as is necessary. Preferably, the leads 26, 28 and electrodes 14, 16 comprise vapor deposited aluminum material.

Figure 3:
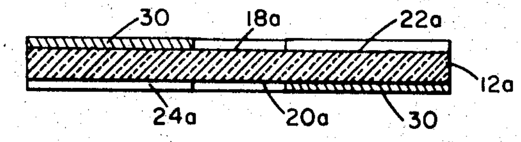
FIGS. 3 and 4 are sectional views illustrating a structural modification of the resonator shown in FIG. 1.

The electrode recesses 18, 20 and the lead recesses 26, 28 may be formed in the wafer surface prior to the vapor deposition process by known masking and etching techniques. Preferably, however, the wafer configuration shown in FIG. 2 is achieved by fabricating a relatively thin wafer **12*a* as shown in FIG. 3, masking the electrode and lead areas, and then vapor depositing a layer 30 of high Q insulating material such as silicon monoxide on the unmasked portions, the deposited layer thickness being equal to the desired depth of recesses 18*a* and 20*a***. The electrodes and leads may be subsequently vapor deposited on the wafer structure thus formed in the same manner as described in connection with FIG. 2.

Figure 4:
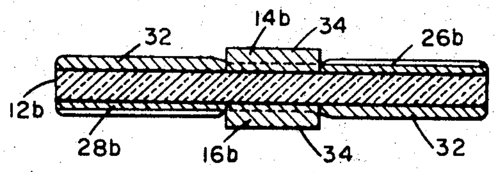

Still another technique of fabricating wafer 12 to the desired configuration is illustrated by FIG. 4. In this embodiment a thin wafer **12*b* of uniform thickness is provided with a vapor deposited layer 32 of aluminum as shown in FIG. 4 to produce a total effectiveness equal to the desired wafer thickness. The electrode and lead areas are then coated with a photoresist material whereupon the structure is submersed in an electrolyte and anodized. The aluminum layer where not protected by the resist will anodize, increase in thickness and become a dense insulating material giving the wafer the desired total effective thickness, the protected regions defining the electrode and lead regions. To achieve the desired mass loading of the electroded region additional material 34** such as aluminum, gold, silver, etc., may be vapor deposited on the non-anodized electrode regions thus formed as indicated in FIG. 4.

In accordance with the theory disclosed in copending application Ser. No. 672,422, now Pat. No. 3,384,768, the resonant frequency $f_a$ of the electroded region may be determined by the following equation:

$$f_a=\frac{N}{t_a}\left[1+2\frac{\rho_e}{\rho_q}\frac{t_e}{t_a}\right]^{-1} \quad (3)$$

where $\rho_e$ is the density of the electrode material and $\rho_q$ is the density of the wafer material (in this case quartz), $t_e$ is the electrode thickness, $t_a$ is the wafer thickness in the electroded region and N is the frequency constant.

The resonant frequency $f_b$ of the non-electroded region ($b$) may be expressed as follows in terms of the frequency constant N and wafer thickness $t_b$:

$$f_b=\frac{N}{t_b} \quad (4)$$

Combining Equations 3 and 4 the resonant frequency ratio $\Omega_0$ may be expressed as follows:

$$\Omega_0=\frac{f_a}{f_b}=\frac{t_b}{t_a}\left[1+2\frac{\rho_e}{\rho_p}\frac{t_e}{t_a}\right]^{-1} \quad (5)$$

It will be apparent that through application of Equations 3, 4 and 5 the electroded and non-electroded regions and electrodes 14 and 16 may be selectively sized to produce a desired resonant frequency difference.

In actual practice the resonator electrode diameter is initially selected in accordance with the characteristics desired, e.g., capacitance, resistance, etc. The value determined and the frequency $f_a$ is then inserted into Equation 1 whereupon the equation is solved for $f_b$. The thicknesses $t_a$, $t_b$ and $t_e$ are then determined from Equations 3 and 4.

The positioning of electrodes 14 and 16 in recesses 18 and 20 permits a substantial electrode thickness with even a large diameter electrode in a high frequency resonator while at the same time achieving the desired small value of mass loading. Optimum characteristics are thus achieved. Such positioning of the electrodes also permits use of substantially smaller mass loading than heretofore practical. Values of $f_a/f_b$ as large as 0.99999 are feasible.

While in the disclosed embodiment of the invention the electrodes 14 and 16 are both formed in recesses it will be apparent to those skilled in the art that one electrode can be alternately positioned on the wafer surface and the other electrode positioned in a recess of increased depth to achieve the desired effective thicknesses of the electroded and the non-electroded regions of the wafer. The recessing of both electrodes is preferred, however, because of the symmetry of the resulting structure.

The following is a tabulation of the dimensions and characteristics of a 50 megacycle 5th harmonic mode resonator in accordance with the present invention and a prior art resonator having electrodes mounted on the wafer surface in the conventional manner, the electrode diameter being the same in both resonators:

| | Prior Art Resonator | Resonator Embodying Invention |
|---|---|---|
| Total resistance, $R_T$, ohms | 84 | 64 |
| Static capacitance, $C_O$, pf | 1.58 | 1.58 |
| Motional capacitance, $C_1$, pf | $2.91\times10^{-4}$ | $2.91\times10^{-4}$ |
| Mechanical Q, $Q_m$ | 129,000 | 170,000 |
| $f_a/f_b$ | 0.999 | 0.999 |
| Electrode Thickness, $t_e$, angstroms | 770 | 2310 |
| Lead Resistance, $R_L$, ohms | 30 | 10 |

In the above example the lead resistance $R_L$ was estimated using measured resistivity at 50 megacycles of an aluminum thin film ($t$=526 angstroms) deposited in the same manner.

From the above data is will be apparent that the present invention permits the electrode thickness to be increased substantially resulting in a substantial decrease in electrode resistance and a substantial increase in Mechanical Q.

The invention has utility in connection with multiresonator structures such as disclosed in copending application Ser. No. 216,846, now Pat. No. 3,222,622. The individual electrodes may be selectively recessed in the manner illustrated in FIG. 2 to achieve the desired characteristics.

While there have been described what at present are believed to be preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

It is desired to secure by Letters Patent of the United States:

1. The method of fabricating a piezoelectric resonator which includes the steps of: fabricating a relatively thin wafer of piezoelectric material; masking an area of one surface of said wafer to be electroded; vapor depositing a high Q insulating material on the unmasked area of said surface to define an electrode cavity; and forming an electrode in said cavity.

2. The method of fabricating a piezoelectric resonator as claimed in claim 1 wherein said electrode is formed by vapor depositing electrically conductive material in said cavity.

3. The method of fabricating a piezoelectric resonator as claimed in claim 2 wherein said insulating material is silicon monoxide and said electrode material is a material selected from the group consisting of aluminum, gold, silver and alloys thereof.

4. The method of fabricating a piezoelectric resonator which includes the steps of: fabricating a relatively thin wafer of piezoelectric material; vapor depositing a coating of electrically conducting material capable of being rendered non-conductive by anodization of at least one major surface of said wafer; masking an area of said coating to define an electrode and anodizing the unmasked area of said coating.

5. The method of fabricating a piezoelectric resonator as claimed in claim 4 wherein said coating material is selected from the group consisting of aluminum and tantalum.

6. The method of fabricating a piezoelectric resonator which includes the steps of: fabricating a wafer of piezoelectric material; forming recesses on the opposite major surfaces of said wafer; and vapor depositing electrically conductive material in said recesses to establish electrodes of predetermined thickness.

7. The method of fabricating a piezoelectric resonator as claimed in claim 6 wherein said recesses are formed by etching.

References Cited

UNITED STATES PATENTS 3,336,487 8/1967 Martyn et al. -------- 310—9.4

OTHER REFERENCES

German Auslegeschrift 1,027,735, April 1958.

WILLIAM L. JARVIS, Primary Examiner

U.S. Cl. X.R.

119—106, 107, 213, 217; 204—38; 310—9.5